United States Patent [19]

Mueller

[11] 4,139,815
[45] Feb. 13, 1979

[54] LINEAR DISTORTION MEASURING

[76] Inventor: Martin Mueller, Elsterweg 31, 7417 Pfullingen, Fed. Rep. of Germany

[21] Appl. No.: 740,103

[22] Filed: Nov. 9, 1976

[30] Foreign Application Priority Data

Jan. 27, 1976 [DE] Fed. Rep. of Germany ....... 2602916

[51] Int. Cl.$^2$ ........................................... G01R 27/00
[52] U.S. Cl. .................................................. 324/57 N
[58] Field of Search .............. 324/57 N, 57 R, 57 DE

[56] References Cited

U.S. PATENT DOCUMENTS

| | | | |
|---|---|---|---|
| 3,623,141 | 11/1971 | Boatwright | 324/57 DE |
| 3,846,593 | 11/1974 | Bradley | 324/57 DE |
| 3,970,926 | 7/1976 | Rigby et al. | 324/57 R |

Primary Examiner—Stanley T. Krawczewicz

[57] ABSTRACT

A test signal composed of two or more harmonically related spectral lines is generated, frequency swept or stepped in fixed phase relationship and transmitted into a device under test. At the output of this device under test, the received signal is suitably amplified, and changes of the signal shape in the time domain are observed. Such changes caused by amplitude or phase misalignments of the device under test are, in turn, evaluated to unveil said misalignments. Various levels of sophistication of this evaluation are described. As simplest, the use of an ordinary oscilloscope in lieu of a receiver is explained, allowing, with certain resolution, the manual plotting of phase and amplitude misalignments. An involved version of the test setup comprises microprocessors for displaying at any desired resolution, besides amplitude, the "genuine" end-to-end phase curve including the quantity known as phase "intercept", of a device under test of any electrical or physical length.

12 Claims, 8 Drawing Figures

LINEAR DISTORTION MEASURING

The invention relates to a method and an instrument for measuring linear signal distortions, more precisely: The parameters that cause such distortions. For such instruments it is known that a carrier wave is amplitude modulated by a test frequency and, additionally, is frequency modulated slowly (swept), that after passing the transmission system under test, the test signal is demodulated and phase and amplitude variations of the test tone are evaluated.

Such instruments known under the name group delay and attenuation test sets have the disadvantage of producing as a phase measurement result a quantity proportional to the slope of the phase characteristic of the unit under test. Investigations have shown that phase distortion is not dependent on the slope of, but on the phase characteristic itself, namely its deviations from a certain straight line in a phase vs. frequency plot, this line being determined by the energy distribution of the signal and by system parameters.

It is known to remove part of the measuring error of the group delay measurement by re-integrating the db/dω curve ($b$ = phase, $\omega$ = angular frequency), U.S. Pat. No. 3,473,113. This would produce the phase deviations from that straight line which represents (as explained in the paper "Signal Delay", IEEE Transactions COM, Nov. 1975, pp 1375-1378) the "signal delay $T_1$" for "flat" energy distribution.

It is the purpose of this invention to cover also the deviations of the phase characteristic from the "signal delay T" (see above mentioned reference), again for the case of flat energy distribution. This means the same as obtaining a measurement criterion for the "phase intercept distortion" as mentioned, e.g., in a paper by H. Mar in IEEE Transactions COM, Aug. 1974, p. 1148. The well-known methods for phase measurement "end to end" (i.e. without transmission of a reference phase) do not provide a possibility for this measurement. Intercept phase distortion can asume substantial values and the adjustment of phase equalizers in, for instance, a data transmission system, executed according to the group delay characteristic and, therefore, "blind" with respect to intercept distortion, often deteriorates — instead of improving - the transmission quality of the system.

For removing this deficiency, an instrument and method has already been proposed, known under the name "PAR-meter" PAR standing for peak to average ratio. In this method, in principle, the widening of a transmitted pulse is being measured, U.S. Pat. No. 3,502,983. However, also this method has disadvantages of being (1) very insensitive and, therefore, useful only for moderate quality requirements, and (2) of being incapable of providing information as to the source of distortion, amplitude or phase, nor as to the frequency position of their deviations. Similar disadvantages are encountered when other known methods of measurement free of the intercept error are being applied, such as the so-called "eye pattern" display of, e.g., data signals. Such methods of measurement are additionally hampered by noise and phase jitter of the system.

All such disadvantages may be removed by a method and instrument for measuring linear distortion parameters including phase intercept distortion and making use of the provisions of this invention. By the method according to this invention the display of characteristic curves is possible as usual, as well as distinguishing between phase and amplitude distortion and their frequency positions, by simple means. An important additional advantage of a measuring method according to this invention is that fast scanning becomes possible which, in turn, enables the processing of the test result in a "double rectification" manner. Another advantage is the fact that instruments according to this invention can be made and used in various steps of perfection and expense. One of the versions is, for moderate requirements of precision, of especially low cost but otherwise without restrictions of proficiency.

According to this invention it is proposed to generate at the transmitting end a measuring signal consisting of at least and preferrably two frequencies of an integer ratio, to feed this signal into the system under test and to obtain at the receiving end, by suitable means, measuring values which are proportional to the deviations of characteristics from the ideal, and to frequency switch or sweep the signal components through a given frequency band, thereby scanning the characteristics in question. Preferably proposed is a measuring signal defined by $$\cos\omega t + \cos2\omega t$$

and, thus, consisting of a basic frequency, $\omega$, and its second harmonic, $2\omega$, both of equal ampitude, and the parameter $\omega$ being varied.

The choice of a measuring signal of this type is based on the knowledge that phase intercept distortion can only be recognized by a signal with substantial bandwidth. The method of measurement can, however, also be applied to systems with smaller relative bandwidth by applying one of the known methods of modulating the test signal onto a carrier. Such modulated transmission can also be advantageous is systems of large enough bandwidth, as will be explained in this specification. The preferable measuring signal is shown in FIG. 1.

The possibility of generating the measuring signal by digital or function generator type methods, for instance from trapezoidal waves, can be taken advantage of. The measuring signal according to this invention is advantageous also in that it can be generated in a PCM type programmed way, controlling the program by a variable clock. In this case it is expedient to chose the number of samples per signal repetition higher than the ratio of upper to lower end of the sweep because this makes possible the use of a fixed low pass for filtering.

The invention is based on the knowledge that this measuring signal, under the influence of amplitude and phase distortion, changes its shape in a way easy to evaluate. These changes are shown in FIGS. 2 and 3 for distortions equivalent to ± 2 dB. It is evident from the figures that this measuring signal can, at the receiving end, be evaluated already by an oscilloscope display, comparing it with the ideal pattern drawn on the screen. Thus, a frequency switchabe two-frequency generator and a simple oscilloscope would form the most simple version of a measuring set according to this invention.

This invention also comprises a method for obtaining better resolution and higher accuracy by extracting voltage samples at certain time "slots" from the received measuring signal and applying suitable known methods for their display. Thus the tracing of characteristics by electromechanical or electronic means becomes possible. In this case each point of the trace ("image point") is the result of a measurement done at two "object points" of the measured (phase or amplitude) curve, namely at frequency f and 2f. For making analyzing easier, the output curve of the instrument can be displayed twice, one of the displays shifted, stretched and polarity reversed, such that one of the curves displayed pertains to the range swept by the basic frequency, f, and the other to that of the harmonic, 2f. Similarities in the overlap of both curves are indicative of the true frequency position of a measured deviation.

Analyzing the curves by the operator can be additionally eased and proportionality can be improved by using the signal in one sweep in its regular form and during the next sweep as an inverted single sideband signal. In this case it is advantageous to have the (supressed!) carrier as near as possible to the upper band limit. In this version of the instrument, two basic difficulties occur: At the transmitting end a generation with sufficient carrier suppression, and at the receiving end the reclamation of a carrier necessary for demodulation and evaluation, for which absolute frequency and phase synchronism is required.

These difficulties are, according to this invention, solved by digitally synthesizing of the transmitted signal. The frequency sweep is replaced by stepping, the steps being chosen narrow enough for the expected onduof the curves to be measured. The frequency scan may, advantageously, be so chosen as depicted, in idealized form, in FIG. 5. Through this form of a scan, information is transmitted enabling the receiver to "compute" the correct carrier frequency, $f_T$, from the step occurring in the received components after one full scan of the 2f component, and can after shifting of this component to the lower band end into the SSB form, synchronize the carrier such that the receiver output (= display) stays constant. For achieving sufficient carrier suppression at the receiving end, a state-of-the-art balanced mixer is usable. In this version of a measuring set according to the present invention it is asumed that processors of not very high level of sophistication are applied in the transmitter as well as in the receiver.

In a sophisticated version of the measuring instrument according to this invention, which can be a further development of either of the selfscanning versions explained so far, a versatile microprocessor is being used in the receiver. Its purpose is to compute, by applicable algorithms, from the respective measured curve, the "true" amplitude curve or/and the "true and flattened" phase curve (i.e. the b-curve minus the distortionless portion of the phase as contained in the signal delay). In this case it is necessary to digitalize the measured values, as well-known as such. This makes it possible to take advantage of other improvements connected with digitalization, like noise suppression.

In this version of the measuring set, also an advantageous solution of the display problem can be realized by using a matrix of light emitting diodes. This matrix can be quite coarse, eg. 10 × 10 diodes, without unduely affecting the accuracy and resolution of the instrument: The presence of the results in digital form makes it easy to expand the (analog) display up to any resolution required.

For the signal processing in the receiver according to this invention, it is advantageous to AGC the signal to a constant hight of the "positive" signal peak, also to apply a sensor for the negative peaks which controls a polarity reversal stage, and switching said stage as soon as one of the negative peaks is "higher" than the positive one. This happens in the case of excessive phase distortion, e.g., in unequalized systems. Reversing the polarity of the received signal before evaluation has the result of a full scale step in the curve displayed. This is of advantage in many applications of the instrument, since it enables the user to estimate the number of equalizer stages necessary just by counting the number of steps. State of the art approaches may be applied to solve problems connected with the signal evaluation: Clock regeneration and synchronization to the positive peaks for the time slots at $\frac{1}{6}$, $\frac{1}{2}$ and $\frac{5}{6}$ of the time interval between positive peaks. The amplitude criterion is sampled at a point (180°) where, in the distortionless case, the voltage is zero anyway, at the sampling points of the phase criterion, however, (120° and/or 240°) the voltage in the distortionless case is - $\frac{1}{2}$ of the peak voltage and must be compensated to zero. This compensation can, most advantageously, be done by subtracting the measured value at 240° from that at 120°. Thus the receiver can be a fully automatic instrument, making the method of measurement according to this invention compatible with known methods of result-retransmission.

Finally, the invention is based on the knowledge that the signal distortions appearing in the time domain are proportional to the rms value of the respective deviations of amplitude and/or phase from the respective ideal responses. In a further development of the invention, therefore, the rms of the measured values per sweep is being determined applying the method of double rectification as known as such. This "second" rectification can, naturully, be executed also after the digital processing and D-A reconversion, as explained above.

The invention will in the following be explained by way of the drawings attached:

FIG. 5a depicts a block diagram of a measuring set-up as used in the invention.

Figure 1:
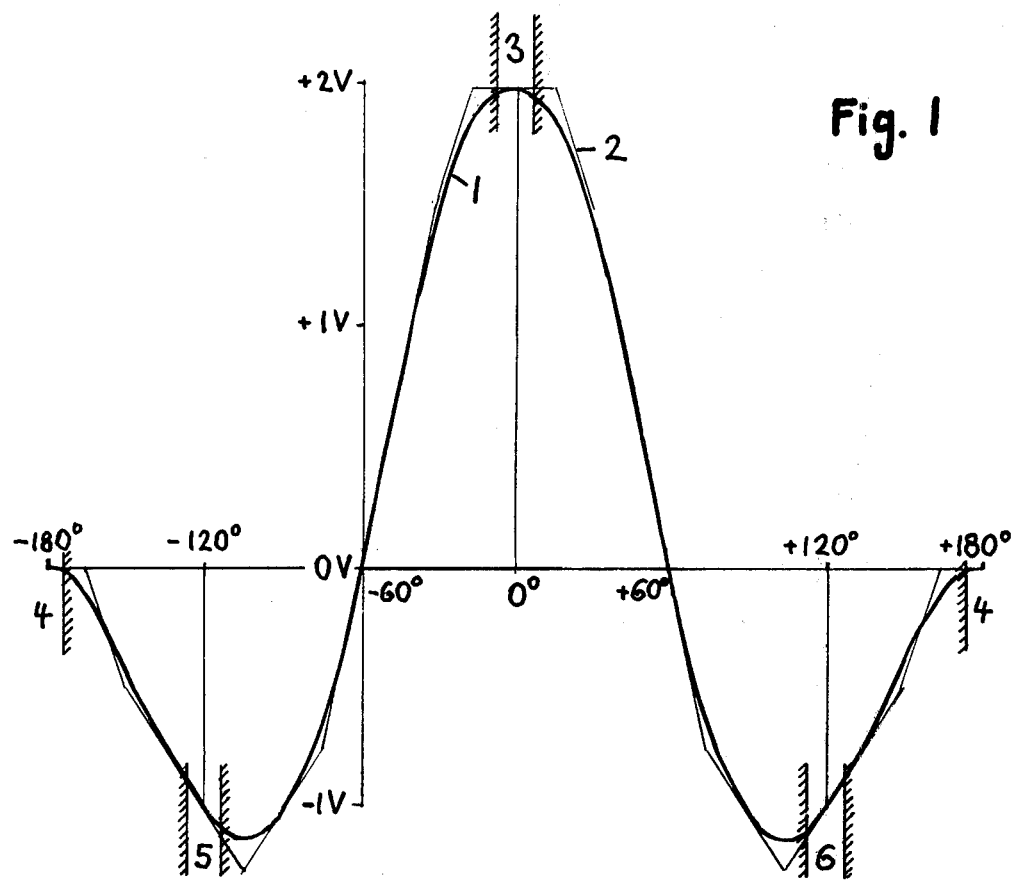
FIG. 1 shows voltage vs. time for the measuring signal $\cos\omega t + \cos 2\omega t$, as preferable according to this invention.

In FIG. 1, 1 is the filtered signal, 2 is the same signal before filtering if generated from trapezoidal oscillations of frequency ratio 1:2, 3 is an example of the time slot for sampling the amplitude criterion, 4 is a time slot for sampling the amplitude distortion, 5 and 6 are time slots for sampling the phase distortion.

Figure 2:
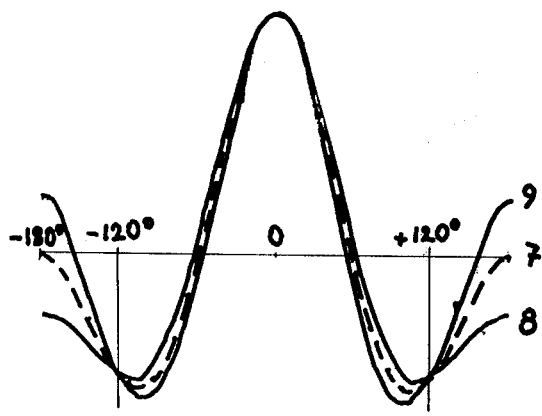
FIG. 2 depicts the changes of shape of the measuring signal due to pure amplitude distortion.

In FIG. 2, 7 is the undistorted signal, 8 is the signal in the case of 4 dB enhancement of the harmonic as compared to the basic frequency, 9 is the signal for a 4 dB attenuated harmonic.

Figure 3:
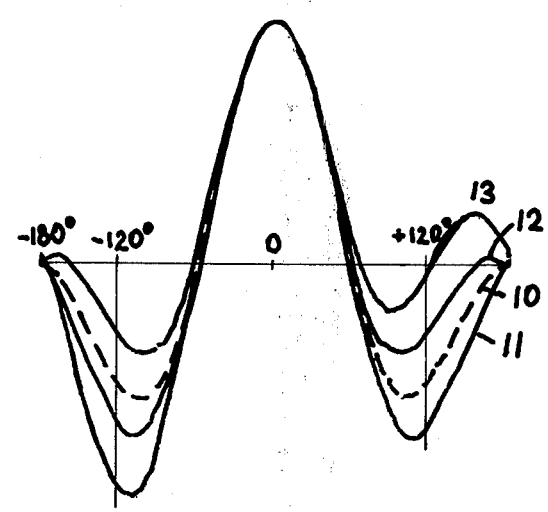
FIG. 3 depicts the changes of shape of the measuring signal due to pure phase distortion.

In FIG. 3, 10 is the undistorted signal again, 11 is the signal for the basic wave "leading" by 16.4° the arrival of the maximum of the measuring signal and the harmonic "lagging" by 8.2°, 12 is the signal for reversed delays. This total phase shift is — in terms of distortion power generated — equivalent to ± 2 dB. 13 depicts the signal in one of the two possible transitions into its orthogonal form. In the case of going through this orthogonal form, the received signal should, before evaluation, be polarity reversed such that now the negative peak becomes the positive peak and is used henceforth as AGC and clock reference.

Figure 4:
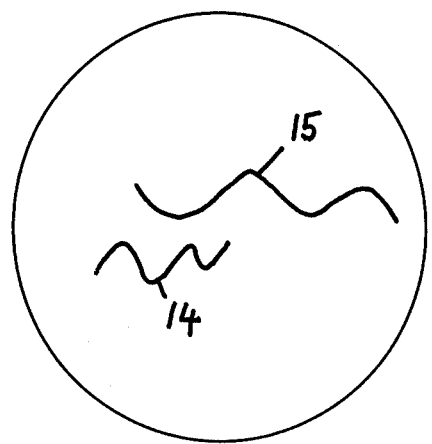
FIG. 4 depicts an example of a "double trace" CRT display (according to claim 7).

In FIG. 4, 14 depicts the trace pertaining to the sweep range of the basic frequency, 15 depicts that of the harmonic.

Figure 5:
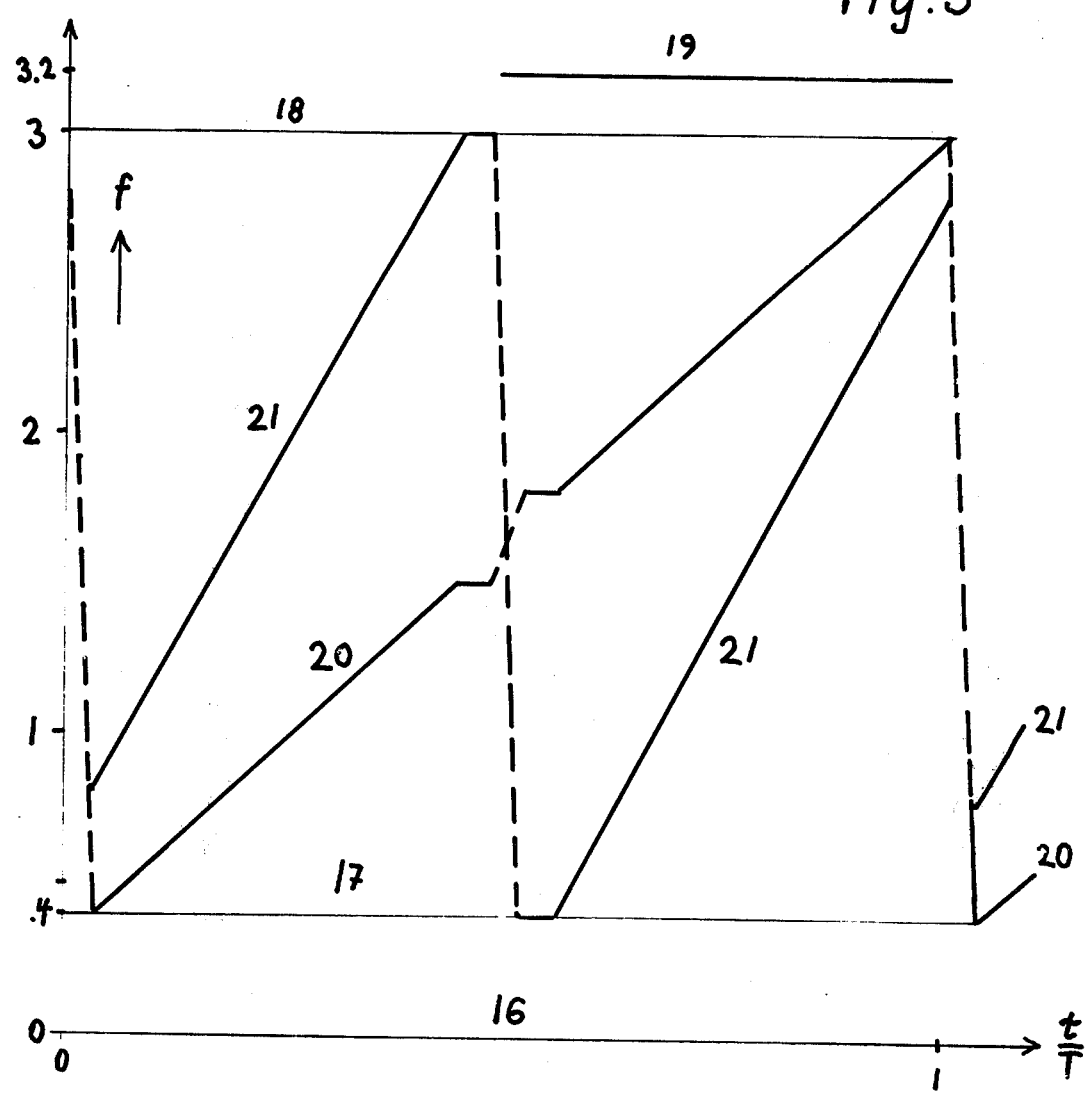
FIG. 5 depicts an idealized frequency scan of the signal components in the case of a transmission alternating between the regular signal and its inverted SSB replica (according to claim 11).

FIG. 5, 16 marks the frequency zero, 17 the lower and 18 the upper band limit, 19 is the carrier frequency necessary for the SSB demodulation, 20 is the variation of the basic frequency component and 21 is that of the harmonic component, for a full "sweep" period, wherby the scan is advantageously executed in pre-programmed small enough steps.

In FIG. 5a 21a is the transmitter (measuring signal generator), 21b is a unit or system under test, 21c is the (measuring) receiver and 21d is a display unit.

Figure 6:
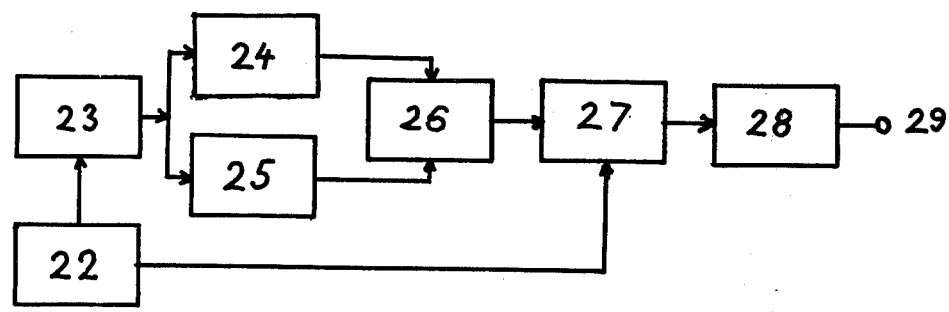
FIG. 6 depicts a detailed block diagram of block 21a of FIG. 5a, a measuring signal generator according to the invention.

FIG. 6 depicts the version of the measuring signal generator without the SSB synthesis asumed in FIG. 5; the synthesizer would unduely complicate the diagram without elucidating the basic features of the invention. 22 is a saw-tooth generator as, for instance, used in the swept frequency generator, type SMLU, by Rohde & Schwarz (R&S), page 86 of the 1974 R&S catalogue, 23 is a variable clock generator which is the same as a swept frequency generator (like SMLU by R&S), 24 and 25 are generators of trapezoidal oscillations as could be generated by combining the square wave generator and the triangular wave generator as used in the type SSN generator by R&S (page 16 of the 1974 catalogue), 26 is an adder stage as used in FIG. 6, page 15 of the R&S catalogue, 27 is a low pass filter, if necessary with automatic tuning, 28 is the output circuitry comprising means for level and impedance matching as used in most of the measuring generators described in the R&S catalogue, and 29 is the transmitter output.

Figure 7:
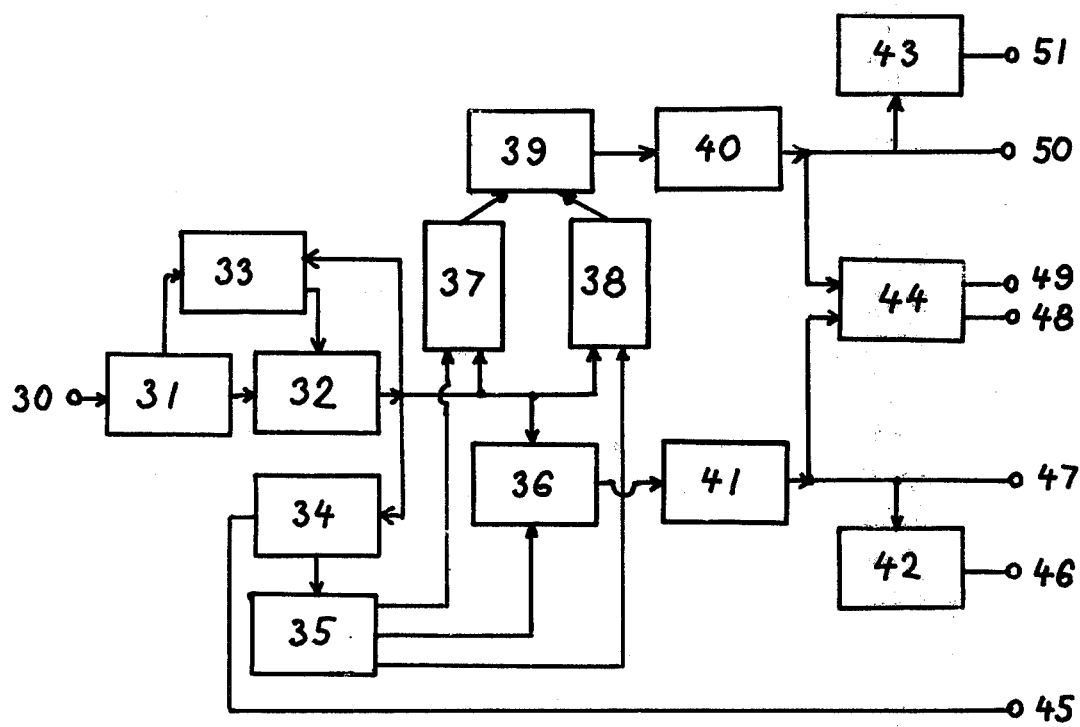
FIG. 7 depicts a detailed block diagram of block 21c of FIG. 5a, a measuring receiver according to the invention.

In FIG. 7, 30 is the input, 31 the input circuitry comprising level and impedance matching as used in most of the measuring receivers shown in the R&S catalogue on pages 142 to 153, 32 is a switchable polarity reversal stage as used in most commercially available oscilloscopes, 33 is a sensor circuit for sensing the positive and negative peaks to obtain the criteria for the automatic gain control and the polarity switch control. 34 depicts a clock reclamation circuit as used in any commercially available oscilloscope for synchronizing the X deflection to the incoming signal, 36, 37 and 38 are gates for the various time slots at 180° and ± 120° off the signal peak, the gates being of the type as used, for instance, in commercial PCM demultiplexing. 40 and 41 are output stages of the simpler version measuring receiver, dirctly feeding a display unit which may employ multiple display as used in the R&S type SWOB and depicted on pages 90 and 91 of the R&S catalogue, 42 and 43 indicate rms rectifiers with time constants long as compared to the sweep period, for which a circuitry as utilized in the R&S type ELT2, page 179 of the catalogue, could be employed, 44 is a combination of an A/D and a D/A converter with a microprocessor for computing the equivalent phase and/or amplitude curves pertaining to the respective measured curves. A/D and D/A converters can be utilized as in the R&S types UGWD, page 102 of the catalogue, and type SSN, page 14 of the catalogue, the micro processor is used in an application quite similar to that described for the "computer" on pages 235 to 237 of the R&S catalogue of 1974. The rectifiers 42 and 43 can also be connected to the outputs of circuit 44. The measuring receiver outputs leading to the display unit, item 21d of FIG. 5a, have the following functions: 45 is the time base output, 46 is the rms output pertaining to amplitude, 47 is the output of the "raw" amplitude curve, 48 and 49 are outputs of the recomputed curves, 50 is the output of the "raw" phase measurement result and 51 is that of the rms of the latter result.

The figures have been so chosen only for easing the explanation of the invention and are not intended to restrict the coverage of the invention as disclosed, in any way.

What is claimed is:

1. Apparatus for measuring linear distortion causing parameters, i.e. misalignments of amplitude and/or phase of a device under test, comprising:
   (a) means for generating and transmitting into said device under test a wave form (signal) which, at any instant, consists of at least two harmonically related frequencies,
   (b) means responsive to said generating means for frequency varying said wave form through a frequency band of interest,
   (c) means responsive to said device under test for receiving and analyzing wave forms in such a way that an ideal transmitted wave form can be virtually reconstructed,
   (d) means responsive to said receiving means for displaying quantitatively the deviations of the received wave form from said ideal wave form,
   (e) means for obtaining a plot of a phase and/or amplitude related quantity pertaining to said device under test.

2. Apparatus according to claim 1 where the generating means produce a wave form including a basic frequency, f, and its second harmonic, 2f, of equal amplitude and zero phase, and the frequency varying means vary f between the lower limit of said frequency band of interest and one half of its upper limit.

3. Apparatus according to claim 1 where said generating means produce approximations of the ideal wave form through digital type circuitry such as used for trapezoidal oscillations or for decoding PCM type signals.

4. Apparatus according to claim 1 where said display means includes an oscilloscope display of said received signal and visual comparison with said ideal signal.

5. Apparatus according to claim 1 where the receiving and analyzing means includes sampling of the received signal at suitable points in such a way as to obtain error signals that allow conclusions as to misalignments of phase and/or amplitude characteristics and can be displayed as curves by suitable displaying means.

6. Apparatus according to claim 2 where the receiving and analyzing means include:
   (a) automatic gain control means sensitive to the peak value of the received signal,
   (b) clock means sensitive to the period of time between two successive peaks of the received signal,
   (c) polarity reversal means sensitive to the ratio between positive and negative peaks of the received signal,
   (d) sampling means controlled by said clock means sampling the signal at the mid points between two successive peaks for obtaining a criterion for the amplitude characteristic of the device under test, and/or sampling at ⅓ and/or ⅔ of the distance between two successive peaks of the signal for obtaining a criterion for the phase characteristic of the device under test and displaying by said displaying means one of the latter two values of their difference.

7. Apparatus according to claim 6 where said displaying means provides a display of the measured curves pertaining to phase and/or amplitude twice, such that one of the curves covers the sweep range of the basic frequency component, the other curve covers the range of the harmonic frequency component, and being a shifted, stretched and polarity reversed replica of the first curve.

8. Apparatus according to claim 5 where the receiving and analyzing means provides digitalization of said error signals and a computation yielding single valued frequency allocations of the amplitude and phase misalignments measured, as well as reconversion into the analog form and displaying of the curves obtained in this manner.

9. Apparatus according to claim 8 where the displaying means includes a matrix of light emitting diodes with or without the possibility of variation of the resolution in X or Y direction.

10. Apparatus according to claim 1, comprising:
  (a) modulating means connected between said generating means and said device under test and preferably operating according to one of the known frequency synthesizing principles,
  (b) demodulating means connected between said device under test and said receiving means and preferably regenerating a carrier if omitted by said modulating means.

11. Apparatus according to claim 10 where said synthesis alternates between a direct signal and a single sideband inverted signal and where said displaying means displays the results successively.

12. Apparatus according to claim 1 comprising rectifying means connected between said analyzing means and said displaying means for obtaining and displaying root mean square values of the measured misalignment curves.

* * * * *